United States Patent
Liu et al.

(10) Patent No.: US 12,112,791 B2
(45) Date of Patent: Oct. 8, 2024

(54) SENSE AMPLIFYING CIRCUIT AND METHOD, AND SEMICONDUCTOR MEMORY

(71) Applicant: CHANGXIN MEMORY TECHNOLOGIES, INC., Hefei (CN)

(72) Inventors: Dong Liu, Hefei (CN); Xikun Chu, Hefei (CN); Tianhao Diwu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 187 days.

(21) Appl. No.: 17/864,669

(22) Filed: Jul. 14, 2022

(65) Prior Publication Data

US 2023/0230633 A1 Jul. 20, 2023

Related U.S. Application Data

(63) Continuation of application No. PCT/CN2022/084275, filed on Mar. 31, 2022.

(30) Foreign Application Priority Data

Jan. 14, 2022 (CN) .......................... 202210041966.4

(51) Int. Cl.
G11C 7/02 (2006.01)
G11C 11/4091 (2006.01)

(52) U.S. Cl.
CPC .................. *G11C 11/4091* (2013.01)

(58) Field of Classification Search
CPC .................................................. G11C 11/4091
USPC .......................................................... 365/207
See application file for complete search history.

(56) References Cited

U.S. PATENT DOCUMENTS

| 7,193,913 | B2 | 3/2007 | Kim | |
| 7,663,962 | B2 | 2/2010 | Jeong | |
| 8,644,101 | B2 | 2/2014 | Jun | |
| 9,455,002 | B2 | 9/2016 | Kim | |
| 2005/0152196 | A1 | 7/2005 | Kim | |
| 2006/0013051 | A1* | 1/2006 | Lee | G11C 7/18 365/205 |
| 2006/0028888 | A1* | 2/2006 | Shin | G11C 11/4091 365/205 |
| 2008/0080280 | A1 | 4/2008 | Jeong | |
| 2012/0195146 | A1 | 8/2012 | Jun | |
| 2015/0255128 | A1 | 9/2015 | Kim | |

(Continued)

FOREIGN PATENT DOCUMENTS

| CN | 104900250 A | 9/2015 |
| CN | 111951872 A | 11/2020 |
| TW | I402970 B | 7/2013 |

*Primary Examiner* — Hoai V Ho
(74) *Attorney, Agent, or Firm* — Kilpatrick Townsend & Stockton LLP

(57) ABSTRACT

Provided are a sense amplifying circuit and method, and a semiconductor memory. The sense amplifying circuit includes: a transmission circuit, configured to receive a signal to be processed and perform transmission on the signal to be processed to obtain an initial transmission signal; and an amplifying circuit, configured to receive a first control signal and the signal to be processed, and perform amplification on the initial transmission signal according to the first control signal and the signal to be processed to obtain a target transmission signal.

16 Claims, 7 Drawing Sheets

(56) References Cited

U.S. PATENT DOCUMENTS

2020/0365226 A1 11/2020 Ryu et al.
2021/0383846 A1 12/2021 Shang

* cited by examiner

SENSE AMPLIFYING CIRCUIT AND METHOD, AND SEMICONDUCTOR MEMORY

CROSS-REFERENCE TO RELATED APPLICATIONS

This is a continuation application of International Patent Application No. PCT/CN2022/084275, filed on Mar. 31, 2022, which claims priority to Chinese patent application No. 202210041966.4, filed on Jan. 14, 2022. The disclosures of International Patent Application No. PCT/CN2022/084275 and Chinese patent application No. 202210041966.4 are hereby incorporated by reference in their entireties.

BACKGROUND

Dynamic Random Access Memory (DRAM) is a semiconductor memory device commonly used in computers, and is composed of many repeated memory cells. In the data reading process, data signals of each memory cell are sequentially read out via a local data line, a global data line and a data bus.

During a read operation of the DRAM, a signal outputted by the local data line needs to be transmitted to the global data line, but a path between the local data line and the global data line is relatively long, and the transmission rate of the data signal is affected by the load effect, increasing a transmission delay and affecting the performance of the DRAM.

SUMMARY

The disclosure relates to the technical field of semiconductor memories, and provides a sense amplifying circuit and method, and a sense amplifying circuit, which may improve a signal transmission speed and reduce a signal transmission delay.

The technical solution of the disclosure is realized as follows.

In a first aspect, embodiments of the disclosure provide a sense amplifying circuit, which may include a transmission circuit and an amplifying circuit.

The transmission circuit is configured to receive a signal to be processed, and perform transmission on the signal to be processed to obtain an initial transmission signal.

The amplifying circuit is configured to receive a first control signal and the signal to be processed, and perform amplification on the initial transmission signal according to the first control signal and the signal to be processed to obtain a target transmission signal.

In a second aspect, embodiments of the disclosure provide a sense amplifying method, applied to a sense amplifying circuit. The method may include the following operations.

A signal to be processed and a first control signal are determined.

Transmission is performed on the signal to be processed to obtain an initial transmission signal.

Amplification is performed on the initial transmission signal according to the first control signal and the signal to be processed to obtain a target transmission signal.

In a third aspect, embodiments of the disclosure provide a semiconductor memory, including the sense amplifying circuit of any one of implementation modes in the first aspect.

The embodiments of the disclosure provide a sense amplifying circuit and method, and a semiconductor memory. The sense amplifying circuit includes a transmission circuit and an amplifying circuit. The transmission circuit is configured to receive a signal to be processed and perform transmission on the signal to be processed to obtain an initial transmission signal. The amplifying circuit is configured to receive a first control signal and the signal to be processed, and perform amplification on the initial transmission signal according to the first control signal and the signal to be processed to obtain a target transmission signal. In this way, signals are amplified by the sense amplifying circuit in the signal transmission process, thereby increasing the signal transmission speed and reducing the signal transmission delay.

DETAILED DESCRIPTION

Figure 1:
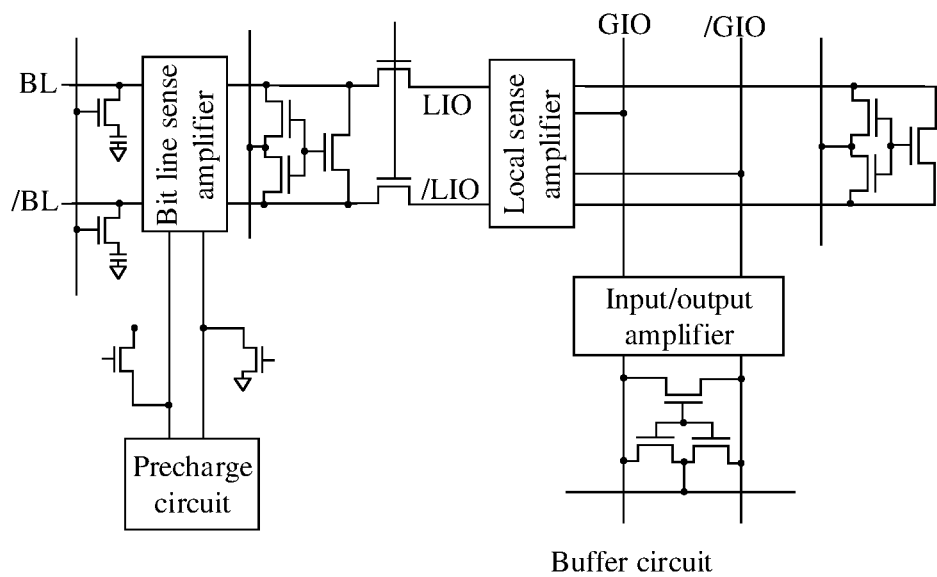
FIG. 1 is a schematic diagram of a signal transmission process provided by the related art.

The technical solutions in the embodiments of the disclosure will be clearly and completely described below in conjunction with the drawings in the embodiments of the disclosure. It is understood that the specific embodiments described herein are only used for explaining the related application, rather than limiting the application. In addition, it is to be noted that, for the convenience of description, only the parts related to the related application are shown in the drawings.

Unless otherwise defined, all technical and scientific terms used herein have the same meanings as commonly understood by one of ordinary skill in the art to which the disclosure belongs. The terms used herein are merely intended to describe the purposes of the embodiments of the disclosure, rather than limiting the disclosure.

In the following description, "some embodiments" involved describes a subset of all possible embodiments, but it is understood that "some embodiments" may be the same or different subsets of all possible embodiments, and may be combined with each other without conflict.

It is pointed out that the term "first\second\third" involved in the embodiments of the disclosure is only used for distinguishing similar objects, and does not represent a specific ordering of objects. It is understood that "first\second\third" may be interchanged to specific sequences or orders if allowed to implement the embodiments of the disclosure described herein in sequences except the illustrated or described ones.

BL: Bit Line
BLSA: Bit Line Sense Amplifier
LSA: Local Sense Amplifier
LIO and /LIO: Local Data Bus
GIO and /GIO: Global Data Bus
I/O: Input/Output
MOSFET: Metal-Oxide-Semiconductor Field-Effect Transistor, MOS for short
NMOS: N-type MOSFET transistor, i.e., electronic-type MOSFET transistor
PMOS: P-type MOSFET transistor, i.e., hole-type MOSFET transistor
TFET: Tunnel Field-Effect Transistor
NTFET: N-type TFET
PTFET: P-type TFET
mV/dec (mV/decade): for every tenfold increase or decrease in current density, the voltage changes by 1 millivolt.

It is understood that, with the continuous high-speed development of the semiconductor industry, the demand for wireless devices and mobile devices is also growing rapidly, so the size of Dynamic Random Access Memory (DRAM) is gradually shrinking, the external supply voltage is reduced, and the market's high-speed demand for DRAM is becoming more and more intense.

Figure 2:
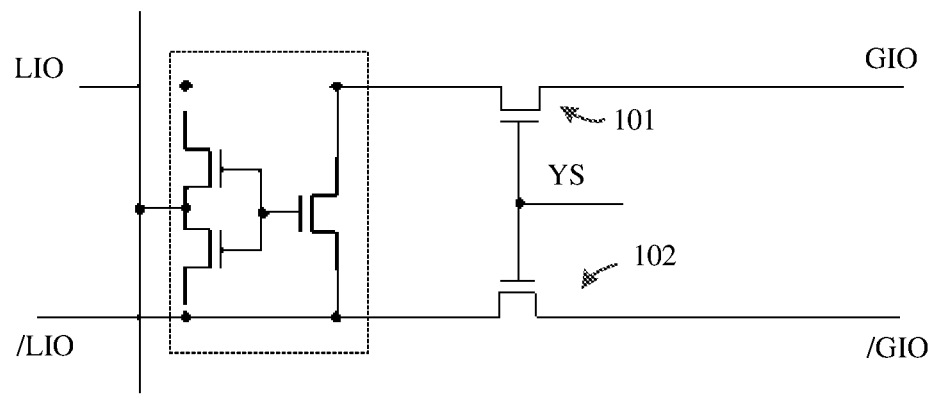
FIG. 2 is a schematic diagram of another signal transmission process provided by the related art.

In the data interaction process of a DRAM memory, it is necessary to involve a Bit Line Sense Amplifier (BLSA), a Local Sense Amplifier (LSA), a Bit Line (BL and /BL), a Local Data Bus (LIO and /LIO), and a Global Data Bus (GIO and /GIO). FIG. 1 illustrates a schematic diagram of a signal transmission process provided by the related art. As shown in FIG. 1, during a read operation of the DRAM, data of a selected memory cell is first transmitted to the BL and /BL, then amplified by the BLSA and transmitted to the LIO and /LIO, and then respectively transmitted to the GIO and /GIO via the LIO and /LIO, and finally transmitted back through an I/O amplifier. FIG. 2 illustrates a schematic diagram of another signal transmission process provided by the related art. As shown in FIG. 2, in the process of transmitting data from an LIO terminal to a GIO terminal, a transistor 101 and a transistor 102 need to be controlled by a control signal (YS), so as to transmit the data from the LIO to the GIO, and from the /LIO to the /GIO.

As shown in FIG. 1 and FIG. 2, due to a long path of a local I/O data line, driving of the amplified data to the I/O amplifier (corresponding to GIO and /GIO terminals) at this time may cause the signal transmission to take a long time due to the excessive load effect, which may slow down the transmission speed. In order to improve the driving capability and increase the signal transmission speed, a Local Sense Amplifier (LSA) circuit needs to be designed between the BLSA and the I/O amplifier to improve a reading speed of the DRAM memory. However, existing LSA circuits still cannot meet the performance requirements of the DRAM. In FIG. 2, the part shown by the dotted box is not an LSA circuit, but a circuit for realizing a precharge function.

The embodiments of the disclosure provide a sense amplifying circuit. The sense amplifying circuit includes a transmission circuit and an amplifying circuit. The transmission circuit is configured to receive a signal to be processed and perform transmission on the signal to be processed to obtain an initial transmission signal. The amplifying circuit is configured to receive a first control signal and the signal to be processed, and perform amplification on the initial transmission signal according to the first control signal and the signal to be processed to obtain a target transmission signal. In this way, signals are amplified by the sense amplifying circuit in the signal transmission process, thereby increasing the signal transmission speed and reducing the signal transmission delay.

The embodiments of the disclosure are described in detail below in conjunction with the drawings.

Figure 3:
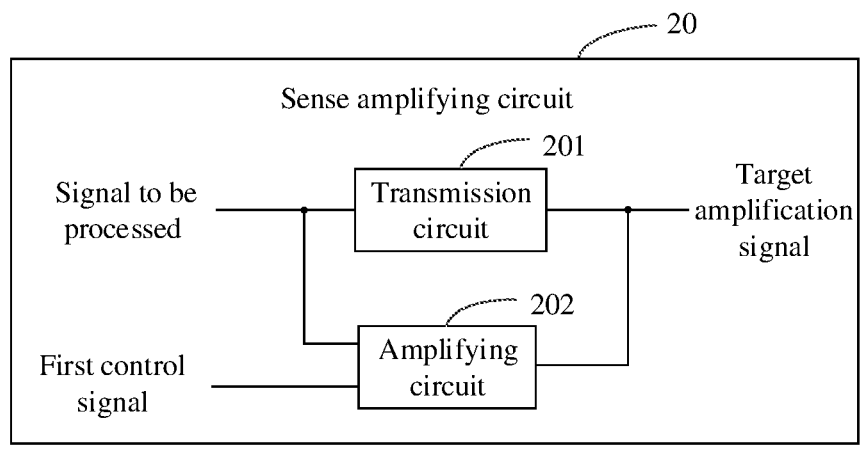
FIG. 3 is a schematic structural diagram of a sense amplifying circuit according to an embodiment of the disclosure.

In an embodiment of the disclosure, FIG. 3 illustrates a schematic structural diagram of a sense amplifying circuit 20 according to the embodiment of the disclosure. As shown in FIG. 3, the sense amplifying circuit 20 may include a transmission circuit 201 and an amplifying circuit 202.

The transmission circuit 201 is configured to receive a signal to be processed, and perform transmission on the signal to be processed to obtain an initial transmission signal.

The amplifying circuit 202 is configured to receive a first control signal and the signal to be processed, and perform amplification on the initial transmission signal according to the first control signal and the signal to be processed to obtain a target transmission signal.

It is to be noted that the sense amplifying circuit 20 in the embodiment of the disclosure is applied to various signal transmission scenarios, and those skilled in the art may flexibly apply the sense amplifying circuit.

For the convenience of description, a signal end located in front of an input end of the sense amplifying circuit 20 is called a data transmitting end (such as the LIO and /LIO), and a signal end located behind an output end of the sense amplifying circuit 20 is called a data receiving end (such as the GIO and /GIO). In other words, the transmission circuit 201 obtains the signal to be processed from the data transmitting end, and the amplifying circuit 202 transmits the target transmission signal to the data receiving end.

Specifically, the transmission circuit 201 is configured to control the transmission process of the signal, that is, whether the signal may be transmitted from the data transmitting end to the data receiving end. When the sense amplifying circuit 20 operates, the transmission circuit 201 receives the signal to be processed and outputs the initial transmission signal. The amplifying circuit 202 is configured to control the amplification process of the signal. When the sense amplifying circuit 20 operates, the amplifying circuit 202 receives a first control signal and the signal to be processed, and amplifies the initial transmission signal, so that the amplified target transmission signal may be better transmitted to the data receiving end, thereby reducing signal delay and improving the transmission rate.

It is to be noted that, in the embodiment of the disclosure, the meaning of signal amplification at least includes: pulling up or pulling down a voltage value of the signal. Exemplarily, when the signal is in a high level state, signal amplification is completed by performing voltage pull-up on the signal, and when the signal is in a low level state, signal amplification is completed by performing voltage pull-down on the signal.

Therefore, the amplifying circuit 202 needs to receive two control signals. The first control signal is configured to indicate whether the amplifying circuit 202 operates, and the signal to be processed is configured to indicate an object on which the amplifying circuit performs voltage pull-up and an object on which the amplifying circuit performs voltage pull-down.

In this way, due to the existence of the sense amplifying circuit 20, it is not only able to control whether the signal is transmitted, but also to perform amplification on the signal (i.e., the initial transmission signal) in the transmission process, so as to improve the driving ability of the signal, reduce the signal transmission delay, and improve the semiconductor performance.

In some embodiments, the signal to be processed may include a first signal to be processed and a second signal to be processed, and a level state of the first signal to be processed is opposite to that of the second signal to be processed. The initial transmission signal may include a first initial transmission signal and a second initial transmission signal, and a level state of the first initial transmission signal is opposite to that of the second initial transmission signal.

Figure 4:
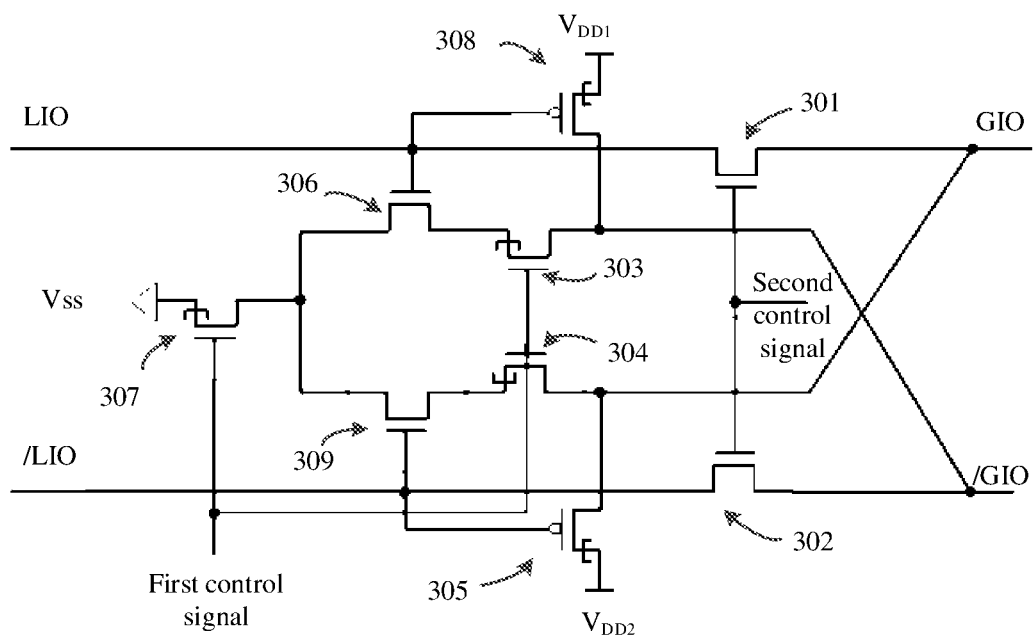
FIG. 4 is a schematic structural diagram of another sense amplifying circuit according to an embodiment of the disclosure.

Correspondingly, FIG. 4 illustrates a schematic structural diagram of another sense amplifying circuit 20 according to the embodiment of the disclosure. As shown in FIG. 4, the transmission circuit 201 may include a first transistor 301 and a second transistor 302, and is configured to receive a second control signal, and responsive to the second control signal being in a first level state, perform transmission on the first signal to be processed through the first transistor 301 to obtain the first initial transmission signal, and perform transmission on the second signal to be processed through the second transistor 302 to obtain the second initial transmission signal.

It is to be noted that the transmission circuit 201 may be disposed on a transmission link between the data transmitting end and the data receiving end, and the working state of the transmission circuit 201 may be controlled by using the second control signal, thereby controlling whether the transmission link between the data transmitting end and the data receiving end is valid.

In some embodiments, as shown in FIG. 4, a first terminal of the first transistor 301 is connected to a first terminal of the second transistor 302 for receiving the second control signal. A second terminal of the first transistor 301 is configured to receive the first signal to be processed, and a third terminal of the first transistor 301 is configured to output the first initial transmission signal. A second terminal of the second transistor 302 is configured to receive the second signal to be processed, and a third terminal of the second transistor 302 is configured to output the second initial transmission signal.

In some embodiments, the transmission circuit 201 is further configured to control the first transistor 301 and the second transistor 302 to be in an ON state responsive to the second control signal being in the first level state, or to control the first transistor 301 and the second transistor 302 to be in an OFF state responsive to the second control signal being in a second level state.

That is, when the second control signal is in the first level state, the first transistor 301 and the second transistor 302 are in the ON state, so that the data transmitting end and the data receiving end are in close state. In this way, the first signal to be processed passes through the first transistor 301 to obtain the first initial transmission signal, and the second signal to be processed passes through the second transistor 302 to obtain the second initial transmission signal. On the contrary, when the second control signal is in the second level state, both the first transistor 301 and the second transistor 302 are in the OFF state, so that the data transmitting end and the data receiving end are in an open state.

In the embodiment of the disclosure, the first level state is higher than the second level state, but the specific level state definition may be adjusted according to a control logic in an actual application environment, and thus does not constitute a relevant limitation.

In some embodiments, the initial transmission signal may include a first initial transmission signal and a second initial transmission signal, and the level state of the first initial transmission signal is opposite to that of the second initial transmission signal.

Correspondingly, the amplifying circuit 202 is configured to receive a first power signal $V_{DD1}$, a second power signal $V_{DD2}$, and a ground signal $V_{ss}$. Voltage values of the first power signal $V_{DD1}$ and the second power signal $V_{DD2}$ are the same or close to each other, and may be collectively referred to as a power signal $V_{DD}$.

Correspondingly, the amplifying circuit 202 is further configured to perform, responsive to the first control signal being in the first level state, the first signal to be processed being in the a first level state, and the second signal to be processed being in the second level state, amplification on the initial transmission signal based on the first power signal $V_{DD1}$ and the ground signal $V_{ss}$ to obtain the target transmission signal, or responsive to the first control signal being in the first level state, the first signal to be processed being in the second level state, and the second signal to be processed being in the first level state, perform amplification on the initial transmission signal based on the second power signal $V_{DD2}$ and the ground signal $V_{ss}$ to obtain the target transmission signal.

It is to be noted that the signal amplification process may be understood as: using the power signal $V_{DD}$ to pull up a high level signal in the initial transmission signal, and using the ground signal to pull down a low level signal in the initial transmission signal. It is understood that the "high level signal" and "low level signal" mentioned in the embodiments of the disclosure are two level signals with relatively high and low levels for a reference voltage. For example, when a voltage of the power signal $V_{DD}$ is 1.8 V, the reference voltage may be half of the voltage of the power signal $\frac{1}{2} V_{DD}$, that is, 0.9 V, then the level signal higher than 0.9 V may be understood as the high level signal, and the level signal lower than 0.9 V may be understood as the low level signal.

The embodiments of the disclosure will be specifically described below in an application scenario where the data transmitting end is a local data line in the DRAM, and the data receiving end is a global data line in the DRAM, but it does not constitute a relevant limitation.

It is understood that in the DRAM, the local data line includes the LIO and /LIO, and the global data line includes the GIO and /GIO. For the convenience of description, the signals corresponding to the LIO and the GIO are respectively referred to as a first signal to be processed, a first initial transmission signal, and a first target transmission signal. The signals corresponding to the /LIO and the /GIO are respectively referred to as a second signal to be processed, a second initial transmission signal, and a second target transmission signal. The first target transmission signal and the second target transmission signal are used for forming the target transmission signal, and the level state of the first target transmission signal is opposite to that of the second target transmission signal.

In a first example case, when the DRAM reads out a logic "1" in a read operation, the first signal to be processed is a high level signal, and the second signal to be processed is a low level signal. In this case, voltage pull-up processing is performed on the first initial transmission signal by using the second power signal $V_{DD2}$ to obtain the first target transmission signal, and voltage pull-down processing is performed on the second initial transmission signal by using the ground signal to obtain the second target transmission signal.

In a second example case, when the DRAM reads out a logic "0" in the read operation, the first signal to be processed is a low level signal, and the second signal to be processed is a high level signal. In this case, voltage pull-down processing is performed on the first initial transmission signal by using the ground signal to obtain the first target transmission signal, and voltage pull-up processing is performed on the second initial transmission signal by using the first power signal $V_{DD1}$ to obtain the second target transmission signal.

Therefore, by performing amplification on the initial transmission signal, the signal transmission performance is improved, the signal transmission rate is increased, and the signal transmission delay is reduced.

In some embodiments, the amplifying circuit 202 includes a third transistor 303, a fourth transistor 304, a fifth transistor 305, a sixth transistor 306, a seventh transistor 307, an eighth transistor 308, and a ninth transistor 309. The third transistor 303, the fourth transistor 304, the fifth transistor 305, the seventh transistor 307, and the eighth transistor 308 are first type transistors, the sixth transistor 306 and the ninth transistor 309 are second type transistors, and a working voltage of the first type transistor is less than that of the second type transistor.

It is to be noted that the embodiments of the disclosure construct the amplifying circuit through different types of field-effect transistors, that is, on the basis of the second type transistor, the first type transistor with a lower working voltage is introduced, and it is expected that the amplifying circuit may better adapt to the low voltage environment, thereby reducing the power consumption of the amplifying circuit itself and improving the performance of the DRAM.

In a specific example, as shown in FIG. 4, a first terminal of the third transistor 303, a first terminal of the fourth transistor 304, and a first terminal of the seventh transistor 307 are connected to the first control signal. A second terminal of the fifth transistor 305 is connected to the first power signal $V_{DD2}$, a second terminal of the eighth transistor 308 is connected to the second power signal $V_{DD1}$, and a third terminal of the seventh transistor 307 is connected to the ground signal $V_{ss}$. A first terminal of the eighth transistor 308 and a first terminal of the sixth transistor 306 are connected to the first signal to be processed. A first terminal of the fifth transistor 305 and a first terminal of the ninth transistor 309 are connected to the second signal to be processed. A third terminal of the sixth transistor 306, a second terminal of the seventh transistor 307, and a third terminal of the ninth transistor 309 are connected to one another. A second terminal of the sixth transistor 306 is connected to a third terminal of the third transistor 303. A second terminal of the ninth transistor 309 is connected to a third terminal of the fourth transistor 304.

A second terminal of the fourth transistor 304 is connected to a third terminal of the fifth transistor 305 for outputting the first target transmission signal. A second terminal of the third transistor 303 is connected to a third terminal of the eighth transistor 308 for outputting the second target transmission signal.

Based on the specific circuit composition of the foregoing amplifying circuit, the signal amplification process of the amplifying circuit is further described below.

Figure 5:
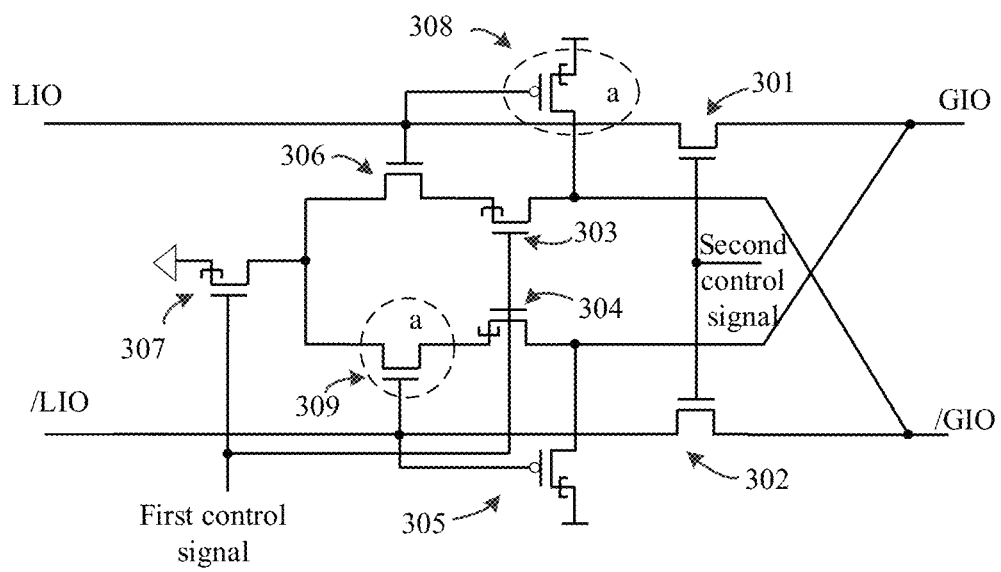
FIG. 5 is a schematic diagram of a working process of a sense amplifying circuit according to an embodiment of the disclosure.

In the foregoing first example case, FIG. 5 illustrates a schematic diagram of a working process of a sense amplifying circuit 20 according to an embodiment of the disclosure. As shown in FIG. 5, the amplifying circuit 202 is further configured to, responsive to the first control signal being in the first level state, the first signal to be processed being in the first level state, and the second signal to be processed being in the second level state, perform charging processing on the first initial transmission signal through the fifth transistor 305 based on the second power signal $V_{DD2}$ to obtain the first target transmission signal, and perform discharging processing on the second initial transmission signal through the third transistor 303, the sixth transistor 306, and the seventh transistor 307 based on the ground signal to obtain the second target transmission signal.

Specifically, as shown in FIG. 5, the amplifying circuit 202 is further configured to, responsive to the first control signal being in the first level state, the first signal to be processed being in the first level state, and the second signal to be processed being in the second level state, determine that the fifth transistor 305, the sixth transistor 306, and the seventh transistor 307 are in an ON state, and that the eighth transistor 308 and the ninth transistor 309 are in an OFF state. It is understood that in FIG. 5, the transistors at a are in the OFF state, and the other transistors are in the ON state.

Figure 6:
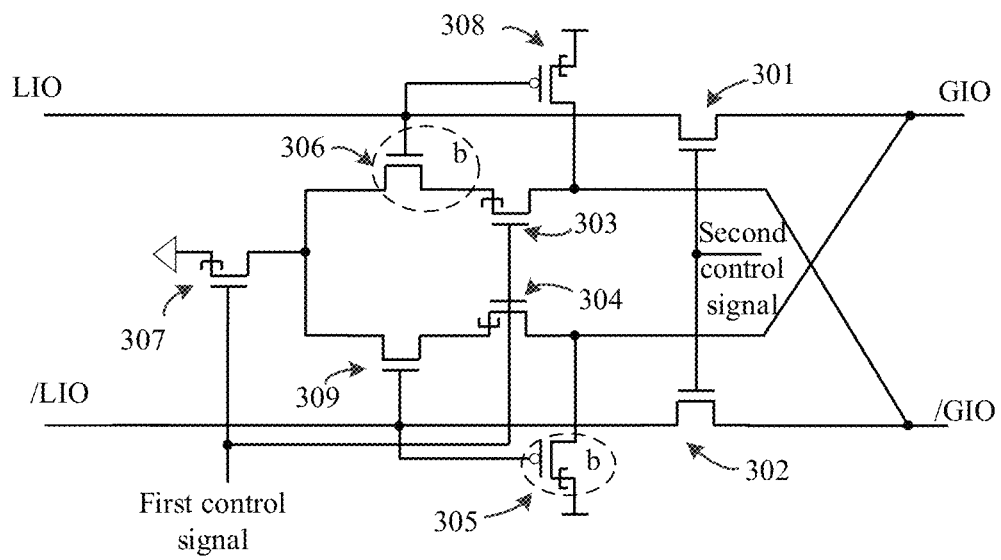
FIG. 6 is a schematic diagram of another working process of a sense amplifying circuit according to an embodiment of the disclosure.

In the foregoing second example case, FIG. 6 illustrates a schematic diagram of another working process of a sense amplifying circuit 20 according to an embodiment of the disclosure. As shown in FIG. 6, the amplifying circuit 202 is further configured to, responsive to the first control signal being in the first level state, the first signal to be processed being in the second level state, and the second signal to be processed being in the first level state, perform charging processing on the second initial transmission signal through the eighth transistor 308 based on the first power signal $V_{DD1}$ to obtain the second target transmission signal, and perform discharging processing on the first initial transmission signal through the fourth transistor 304, the seventh transistor 307, and the ninth transistor 309 based on the ground signal to obtain the first target transmission signal.

Specifically, as shown in FIG. 6, the amplifying circuit 202 is further configured to, responsive to the first control signal being in the first level state, the first signal to be processed being in the second level state, and the second signal to be processed being in the first level state, determine that the seventh transistor 307, the eighth transistor 308, and the ninth transistor 309 are in an ON state, and that the fifth transistor 305 and the sixth transistor 306 are in an OFF state. It is understood that in FIG. 6, the transistors at b are in an OFF state, and the other transistors are in an ON state.

It is to be noted that the first example case and the second example case represent different data read out by the DRAM. Assuming that the first case is when the DRAM needs to read the logic "1", and the second case is when the DRAM needs to read the logic "0", then the working process of the amplifying circuit includes the following.

(1) When the DRAM reads out the logic "1" in the read operation, the first control signal is in a high level state, the first signal to be processed is a high level signal, and the second signal to be processed is a low level signal. In this case, the fifth transistor 305 is turned on, and the first initial transmission signal is charged by using the second power signal $V_{DD2}$, thereby completing the voltage pull-up processing of the first initial transmission signal. The third transistor 303, the sixth transistor 306, and the seventh transistors 307 are turned on, and the second initial transmission signal is discharged by using the ground signal, thereby completing the voltage pull-down processing of the second initial transmission signal.

(2) When the DRAM needs to read out the logic "0", the first control signal is in the high level state, the first signal to be processed is a lower level signal, and the second signal to be processed is a high level signal. In this case, the eighth transistor 308 is turned on, and the second initial transmission signal is charged by using the first power signal $V_{DD1}$, thereby completing the voltage pull-up processing of the second initial transmission signal. The fourth transistor 304, the seventh transistor 307, and the ninth transistors 309 are turned on, and the first initial transmission signal is discharged by using the ground signal, thereby completing the voltage pull-down processing of the first initial transmission signal.

In this way, the working states of the fifth transistor 305 to the ninth transistor 309 may be controlled by the first control signal and the signal to be processed, so as to realize the amplification of the initial transmission signal, thereby increasing the signal transmission rate and improving the signal delay. At the same time, the amplifying circuit is realized by two types of transistors, and may work in a low voltage environment and have a wider range of application scenarios.

In some embodiments, the first type of field-effect transistor is a Metal-Oxide-Semiconductor Field-Effect Transistor (MOSFET), and the second type of field-effect transistor is a Tunnel Field-Effect Transistor (TFET).

Correspondingly, the third transistor 303, the fourth transistor 304, and the seventh transistor 307 are N-type Tunnel Field-Effect Transistors (NTFET). The fifth transistor 305 and the eighth transistor 308 are P-type Tunnel Field-Effect Transistors (PTFET). The first transistor 301, the second transistor 302, the sixth transistor 306, and the ninth transistor 309 are N-type Metal-Oxide-Semiconductor Field-Effect Transistors (NMOS).

It is to be noted that, in the foregoing description, a first terminal of the PTFET is a gate pin, a second terminal of the PTFET is a source pin, and a third terminal of the PTFET is a drain pin. A first terminal of the NTFET is a gate pin, a second terminal of the NTFET is a drain pin, and a third terminal of the NTFET is a source pin. A first terminal of the NMOS is a gate pin, a second terminal of the NMOS is a drain pin, and a third terminal of the NMOS is a source pin.

It is to be noted that, compared with the MOS transistor, the TFET has a lower working voltage and may work at a low working voltage. The detailed description of the TFET may refer to the subsequent embodiments.

In the embodiments of the disclosure, voltage values of the first power signal $V_{DD1}$ and the second power signal $V_{DD2}$ are the same or close to each other, and may be collectively referred to as $V_{DD}$. The NTFET is turned on when the gate voltage is greater than $\frac{1}{2} V_{DD}$. The PTFET is turned on when the gate voltage is less than $\frac{1}{2} V_{DD}$. In this way, the amplifying circuit 202 may be controlled in a lower voltage environment, thereby reducing power consumption and improving control efficiency.

In addition, the necessity of the sixth transistor 306 and the ninth transistor 309 will be described.

It is understood that there are a large number of memory cells in the DRAM, and memory cells in different areas need to be transferred to the global data lines through different local data lines. Prior to the read operation of the DRAM, all local data lines may be charged to a reference value (usually $\frac{1}{2} V_{DD}$), and then the selected memory cell is read, and the signal to be processed is generated on the local data line corresponding to the selected memory cell. However, the local data lines corresponding to those unselected memory cells do not generate valid signals.

Assuming that the sixth transistor 306 and the ninth transistor 309 do not exist in the sense amplifying circuit 20, for the local data lines corresponding to those unselected memory cells, the LIO and the /LIO are in the $\frac{1}{2} V_{DD}$ state. If the fifth transistor 305 and the eighth transistor 308 are common MOSFETs, and the working voltages are greater than $\frac{1}{2} V_{DD}$. In this case, the fifth transistor 305 and the eighth transistor 308 are not turned on, so no valid signal to be processed is on the LIO and the /LIO.

However, in the embodiments of the disclosure, since the fifth transistor 305 and the eighth transistor 308 adopt TFETs, the working voltage of the TFET is lower, so that the fifth transistor 305 and the eighth transistor 308 are turned on in the $\frac{1}{2} V_{DD}$ state, which causes a Direct Current (DC) between the LIO and the GIO, and between /LIO and the /GIO, providing false signals. To resolve this problem, as shown in FIG. 4 to FIG. 6, the sixth transistor 306 and the ninth transistor 309 are added to the sense amplifying circuit 20, and the sixth transistor 306 and the ninth transistor 309 are in an OFF state at $\frac{1}{2} V_{DD}$, thereby blocking the unnecessary current on the unselected LIO and /LIO data lines.

Therefore, in some embodiments, the sense amplifying circuit 20 is further configured to generate the signal to be processed in a selected state, or generate a reference signal in an unselected state. A level state of the reference signal is between the working voltage of the first type transistor and the working voltage of the second type transistor.

The sense amplifying circuit 20 is further configured to control the sense amplifying circuit 20 to be in a working state through the second type transistors according to the signal to be processed, or control the sense amplifying circuit 20 to be in a blocking state through the second type transistors according to the reference signal.

The selected state of the sense amplifying circuit 20 refers to: the memory cells selected by the DRAM during the read operation are connected to the sense amplifying circuit 20. The unselected state of the sense amplifying circuit 20 refers to: the memory cells selected by the DRAM during the read operation are not connected to the sense amplifying circuit 20.

Specifically, the sense amplifying circuit 20 is further configured to control the sixth transistor 306 to be in an ON state and the ninth transistor 309 to be in an OFF state, or the sixth transistor 306 to be in an OFF state and the ninth transistor 309 to be in an ON state according to the signal to be processed, so that the sense amplifying circuit 20 is in the working state; or control the sixth transistor 306 and the ninth transistor 309 to be in an OFF state according to the reference signal, so that the sense amplifying circuit 20 is in the blocking state.

Therefore, through the sixth transistor 306 and the ninth transistor 309 of the second type, the sense amplifying circuit 20 may be prevented from generating additional current in the unselected state, thereby preventing signal errors.

The embodiments of the disclosure provide a local sense amplifying circuit composed of MOSFETs and TFETs with a hybrid process. In the circuit, some of the MOSFET transistors are replaced with the TFETs, the source terminal of the NTFET transistor is connected to $V_{SS}$, and the source terminal of the PTFET transistor is connected to the $V_{DD}$ power supply, which overcomes the unidirectional conductivity problem of the TFET transistor. Moreover, a differential circuit structure is formed by using transistors of two different processes to amplify the signals transmitted from the LIO and /LIO data lines to a certain extent, thereby improving the reading speed of the DRAM memory.

The embodiments of the disclosure provide a sense amplifying circuit. The sense amplifying circuit includes a transmission circuit and an amplifying circuit. The transmission circuit is configured to receive a signal to be processed and perform transmission on the signal to be processed to obtain an initial transmission signal. The amplifying circuit is configured to receive a first control signal and the signal to be processed, and perform amplification on the initial transmission signal according to the first control signal and the signal to be processed to obtain a target transmission signal. In this way, signals are amplified by the sense amplifying circuit in the signal transmission process, thereby increasing the signal transmission speed and reducing the signal transmission delay.

Figure 7:
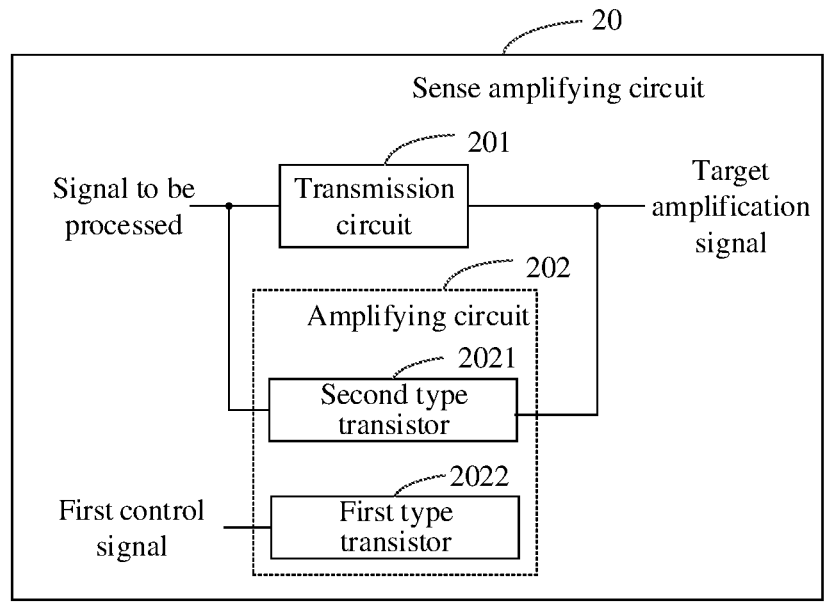
FIG. 7 is a schematic structural diagram of another sense amplifying circuit according to an embodiment of the disclosure.

In another embodiment of the disclosure, FIG. 7 illustrates a schematic structural diagram of another sense amplifying circuit 20 according to the embodiment of the disclosure. As shown in FIG. 7, the sense amplifying circuit 20 may include a transmission circuit 201 and an amplifying circuit 202.

The transmission circuit 201 is configured to receive a signal to be processed, and perform transmission on the signal to be processed to obtain an initial transmission signal.

The amplifying circuit 202 is configured to receive a first control signal and the signal to be processed, and perform amplification on the initial transmission signal according to the first control signal and the signal to be processed to obtain a target transmission signal.

It is to be noted that, in the embodiments of the disclosure, the sense amplifying circuit 20 between the local data line (LIO and /LIO) and the global data line (GIO and /GIO) of the DRAM is taken as an example for explanation, and does not constitute a relevant limitation.

That is, in some embodiments, the sense amplifying circuit 20 is located between the local data line and the global data line and is configured to receive the signal to be processed from the local data line through the transmission circuit 201, and transmits the target transmission signal to the global data line through the amplifying circuit 202.

In some embodiments, as shown in FIG. 7, the amplifying circuit 202 includes a first type transistor 2021 and a second type transistor 2022 and configured to control a working state of the first signal to be processed by using the first control signal and the signal to be processed, and control a working state of the second type transistor by using the signal to be processed, to obtain the target transmission signal.

The working voltage of the first type transistor 2021 is less than the working voltage of the second type transistor 2022.

It is to be noted that, the amplifying circuit 202 has two types of field-effect transistors, and the working voltage of the first type transistor 2021 is less than the working voltage of the second type transistor 2022. That is, a field-effect transistor with a low working voltage is introduced into the amplifying circuit 202, so that the amplifying circuit 202 may work in a low voltage environment and has a better signal amplification function.

Exemplarily, the first type transistor 2021 may be a Tunnel Field-Effect Transistor (TFET), and the second type transistor 2022 may be a Metal-Oxide-Semiconductor Field-Effect Transistor (MOSFET).

It is to be noted that, in order to improve the reading speed of the DRAM, many circuit structures of sense amplifying circuits has been proposed, but the dynamic power consumption is also increased while achieving a high speed. Therefore, the embodiments of the disclosure are expected to provide a sense amplifying circuit, which not only improves the signal transmission speed, but also reduces the power consumption of the circuit as much as possible. Therefore, the embodiments of the disclosure focus on a Tunnel Field-Effect Transistor (TFET) with a low working voltage and a higher current switching ratio. The working principle of the TFET is band to band tunneling. The TFET has an asymmetric doping structure of source and drain areas, the working characteristic of unidirectional conductivity, and the advantages of low working voltage, small sub-threshold swing, low off-state current and high current switching ratio.

Figure 8:
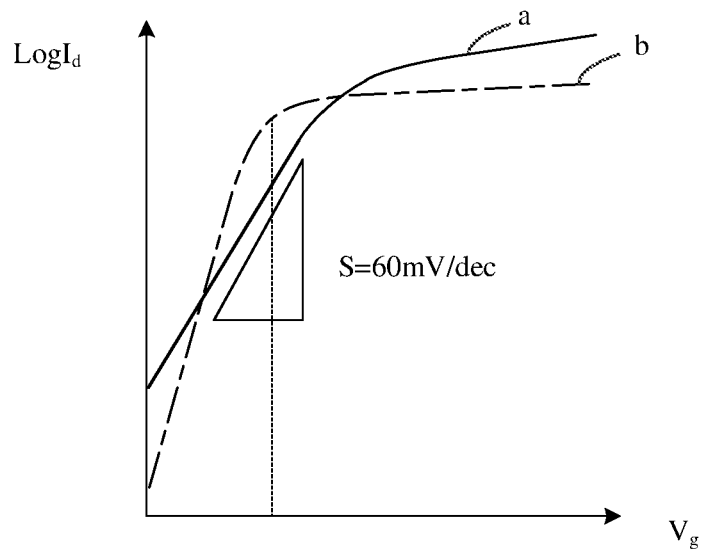
FIG. 8 is a schematic diagram of current changes of different types of transistors according to an embodiment of the disclosure.

FIG. 8 illustrates a schematic diagram of current changes of different types of transistors according to an embodiment of the disclosure. X-axis (i.e., the horizontal axis) represents $V_g$, i.e., a gate voltage. Y-axis (i.e., the vertical axis) represents Log $I_d$, i.e., a logarithm of a drain current. Curve b is used for indicating the TFET, and curve a is used for indicating the MOSFET. As shown in FIG. 8, a sub-threshold swing S of the conventional MOSFET is 60 mV/dec, a sub-threshold swing S of the TFET may break through the limit of 60 mV/decade, and $I_{off}$ (off current) of the TFET is extremely low, so the working voltage of the TFET may be further reduced. As shown by the dotted line in FIG. 8, at a relatively small gate voltage $V_g$, both $I_{on}$ (on-state current) and $I_{on}/I_{off}$ of the TFET are larger than $I_{on}$ and $I_{on}/I_{off}$ of the conventional MOSFET. Thus, the TFET is a very promising logic device of low working voltage and low power consumption.

Figure 9:
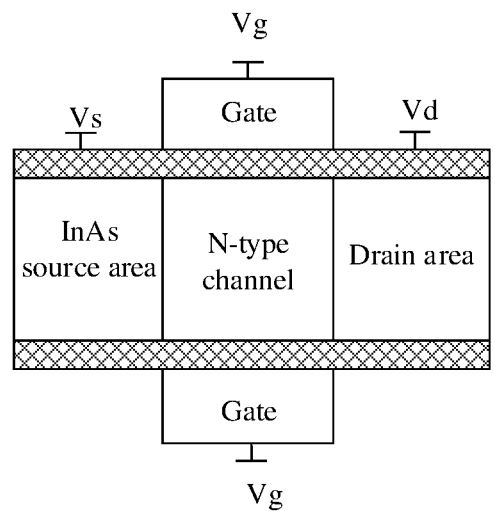
FIG. 9 is a schematic structural diagram of a tunnel field-effect transistor (TFET) transistor according to an embodiment of the disclosure.

The TFET transistor may be specifically a double-gate indium arsenide (InAs) heterojunction tunnel field-effect transistor structure. FIG. 9 illustrates a schematic structural diagram of a TFET transistor according to an embodiment of the disclosure. As shown in FIG. 9, the TFET transistor includes an InAs source area, a drain area and a double gate (Gate). A structure of the TFET device is similar to that of a MOSFET. In the MOSFET, the source and the drain are of the same doping type, and the doping type thereof is opposite to that of a substrate, whereas in a TFET, the source and the drain are of opposite doping types, and the drain area has the same high-concentration doping type as the substrate, that is, FIG. 9 is an example of an NTFET. According to the structural configuration, the TFET is essentially equivalent to a combination of several devices: (1) a reverse P-I-N diode in the off state: (2) a tunnel diode in the on state: (3) a MOS diode forming an inversion layer or a barrier layer under the action of the gate voltage.

Figure 10A:
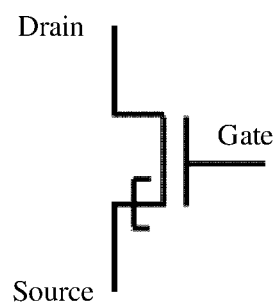
FIG. 10A is a schematic symbol diagram of an N-type TFET (NTFET) according to an embodiment of the disclosure.
Figure 10B:
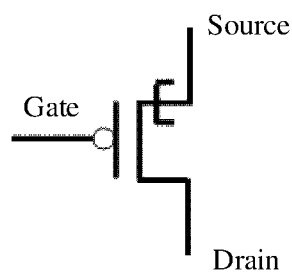
FIG. 10B is a schematic symbol diagram of a P-type TFET (PTFET) according to an embodiment of the disclosure.

In addition, the type of TFET includes an NTFET and a PTFET, the symbol of the NTFET is as shown in FIG. 10A, and the symbol of the PTFET is as shown in FIG. 10B. In the NTFET, the substrate is N-type lightly doped, the source area and the drain area are P-type heavily doped and N-type heavily doped, respectively. For the PTFET, the substrate is P-type lightly doped, the source area and the drain area are N-type heavily doped and P-type heavily doped, respectively.

Figure 11:
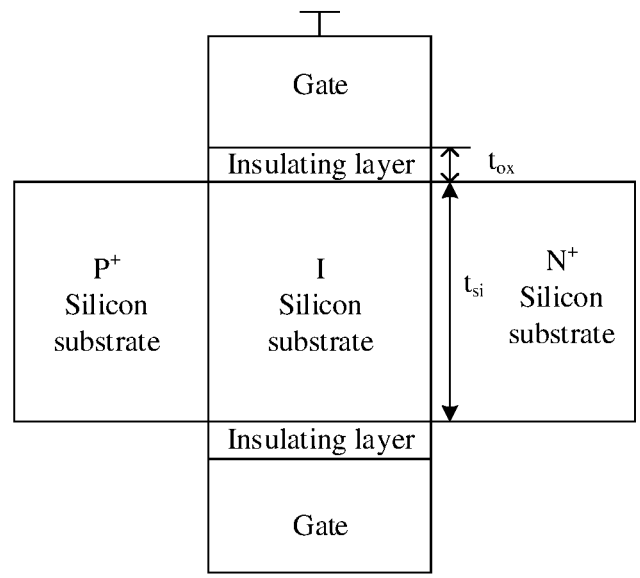
FIG. 11 is a schematic structural diagram of another TFET according to an embodiment of the disclosure.
Figure 12A:
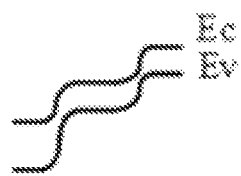
FIG. 12A is a schematic diagram of an energy band of a TFET transistor in an OFF state according to an embodiment of the disclosure.
Figure 12B:
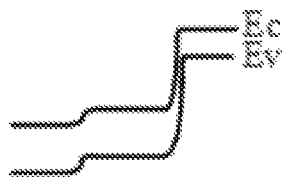
FIG. 12B is a schematic diagram of an energy band of a TFET transistor in an ON state according to an embodiment of the disclosure.

FIG. 11 illustrates a schematic structural diagram of another TFET transistor according to an embodiment of the disclosure. As shown in FIG. 11, the TFET sequentially includes a P-type heavily doped area (i.e., a $P^+$ area, hereinafter referred to as P), a lightly doped area (i.e., an I area, hereinafter referred to as I), and an N-type heavily doped area (i.e., an $N^+$ area, hereinafter referred to as N). When the TFET transistor is in an equilibrium state, the built-in potential of a P-I junction and an I-N junction may produce a stepped energy band profile. FIG. 12A illustrates a schematic diagram of an energy band of a TFET transistor in an OFF state according to an embodiment of the disclosure. FIG. 12B illustrates a schematic diagram of an energy band of a TFET transistor in an ON state according to an embodiment of the disclosure. In FIG. 12A and FIG. 12B, Ec and Ev represents different valence bands. As shown in FIG. 12A, when the TFET transistor is in the OFF state, a P-I-N diode is reversely biased, resulting in a thick tunnel barrier between different energy bands in the working area. The thick tunnel barrier reduces the probability of tunneling, resulting in a small off-state current. As shown in FIG. 12B, when the TFET transistor is in the ON state, as the gate voltage increases, the width of the tunnel barrier gradually decreases, and charge carriers tunnel from a valence band of the source area to a conduction band of the channel area, and then reach a conduction band of the drain area. This band-to-band tunneling process is the main reason for carrier injection in the source area. Due to existence of a Band To Band Tunneling (BTBT) barrier, the off-state current of the TFET transistor is always lower than that of the conventional MOSFET transistor.

The voltage between the gate and the source is represented by $V_{gs}$, and the working voltage of the TFET is represented by $V_{th}$. When $V_{gs} > V_{th}$, the NTFET transistor is turned on, and when $V_{gs} < V_{th}$, the PTFET transistor is turned on. In the OFF state, the P-I-N diode is always reversely biased, resulting in an ultra-low leakage current. Taking the NTFET as an example, the substrate is N-type lightly doped, resulting in N-area accumulation as the gate (G) voltage increases. In the NTFET, when an appropriate bias voltage is applied to the gate, electrons tunnel from the P-type doped area into the channel and then flow into the N-type doped area.

That is, as shown in FIG. 11, $t_{ox}$ represents a thickness of a gate dielectric, and $t_{si}$ represents a thickness of a bulk silicon. The TFET is of a P+-I-N+ structure, and the gate dielectric and a gate electrode are provided above the I area. The energy band of the I area is modulated by changing the gate voltage to control the current of a device. In the NTFET, the substrate is N-type lightly doped, the P-doped area is called the source (an electron source), and the N-type doped area is called the drain. When $V_{gs} > V_{th}$, the NTFET is turned on. For the PTFET, the substrate is P-type lightly doped, a negative gate voltage may form accumulated holes, electrons tunnel from the P channel area into the N-doped area, and generate holes in the channel to flow to the P-doped area. Therefore, in the PTFET, the P-doped area is named a drain (D), and the N-doped area is named a source (S).

Therefore, by introducing the TFET into the amplifying circuit, it is expected that the amplifying circuit may better adapt to the low voltage environment, thereby reducing the power consumption of the amplifying circuit itself and improving the performance of the DRAM.

The amplifying circuit 202 cannot be entirely composed of the first type transistors 2021 for the following reasons.

Since the first type transistors 2021 have lower working voltage, and are in the ON state at ½ $V_{DD}$, unnecessary current may be generated in the amplifying circuit 202 corresponding to those unselected memory cells. Specifically, even if no signal to be processed is received in the sense amplifying circuit 20, circuit nodes in the sense amplifying circuit 20 may be charged to the voltage of ½ $V_{DD}$ during the precharging process. In this case, the first type transistors 2021 are turned on, thereby generating an unnecessary current.

Therefore, in some embodiments, the sense amplifying circuit 20 is further configured to generate the signal to be processed in the selected state, and control the sense amplifying circuit 20 to be in a working state through the second type transistors 2022 according to the signal to be processed; or generate a reference signal in the unselected state, and control the sense amplifying circuit 20 to be in a blocking state through the second type transistors 2022 according to the reference signal.

The level state of the reference signal is between the working voltage of the first type transistors 2021 and the working voltage of the second type transistors 2022.

It is to be noted that, the second type transistors 2022 need to be introduced into the amplifying circuit 202, so as to block the unnecessary current in the unselected state. The details may refer to the foregoing embodiments.

In some embodiments, as shown in FIG. 4, the sense amplifying circuit 20 includes three NTFET transistors, two PTFET transistors, and four MOSFET transistors. The three NTFETs are respectively denoted as the third transistor 303, the fourth transistor 304, and the seventh transistor 307. The two PTFETs are respectively denoted as the fifth transistor 305 and the eighth transistor 308. The four MOSFETs are respectively denoted as the first transistor 301, the second transistor 302, the sixth transistor 306, and the ninth transistor 309. The specific connection relationships are as shown in FIG. 4.

The first control signal that controls the DRAM memory to perform the read operation is electrically connected to a gate of the seventh transistor 307, and a source of the seventh transistor 307 is electrically connected to $V_{SS}$. The second control signal is electrically connected to gates of the first transistor 301 and the second transistor 302. Source terminals of the eighth transistor 308 and the fifth transistor 305 are electrically connected to $V_{DD}$. The LIO is electrically connected to a gate of the sixth transistor 306, the /LIO is electrically connected to a gate of the ninth transistor 309. A drain of the fourth transistor 304 is electrically connected to the GIO, and a drain of the eighth transistor 308 is electrically connected to the /GIO. A source of the sixth transistor 306 is electrically connected to a source of the third transistor 303. A source of the ninth transistor 309 is electrically connected to a source of the fourth transistor 304.

In the hold state, both the first control signal and the second control signal are at a low level "0". When the DRAM memory performs a read "1" operation, the first control signal and the second control signal are set to high level "1", and in this case, the LIO is at high level "1", and the /LIO is at low level "0", the seventh transistor 307 to the fourth transistor 304, the fifth transistor 305 and the sixth transistor 306 are turned on, and the eighth transistor 308 and the ninth transistor 309 are turned off. A /GIO signal is discharged to $V_{SS}$ through the seventh transistor 307, the third transistor 303, and the sixth transistor 306. Moreover, $V_{DD}$ charges the GIO signal line to $V_{DD}$ through the sixth transistor 306. The read "1" operation is complete. When the DRAM memory performs a read "0" operation, the first control signal and the second control signal are set to high level "1", and in this case, the LIO is at high level "1", and the /LIO is at low level "0", the seventh transistor 307 to the fourth transistor 304, the eighth transistor 308 and the ninth transistor 309 are turned on, and the fifth transistor 305 and the sixth transistor 306 are turned off. The GIO signal is discharged to $V_{SS}$ through the seventh transistor 307, the fourth transistor 304, and the ninth transistor 309. Moreover, $V_{DD}$ charges the /GIO signal to $V_{DD}$ through the eighth transistor 308. The read "0" operation is complete. In this way, use of this circuit structure improves the DRAM reading speed, reduces the load effect of the LIO data line, and has low power consumption and high control efficiency.

In the precharge stage, there are unselected LIO data lines (the LIO data lines corresponding to the unselected memory cells). In this case, the LIO data lines and the /LIO data lines are ½ $V_{DD}$. There is a DC current after the fifth transistor 305 and the eighth transistor 308 are turned on, so the sixth transistor 306 and the ninth transistor 309 are utilized to block a DC current path between the LIO data line and the GIO data line. In this way, the unselected LIO data lines will not have additional effects.

That is, when the DRAM memory performs a read operation, since the unselected LIO data lines are charged to ½ $V_{DD}$, the fifth transistor 305/the eighth transistor 308 are turned on at this time, resulting in a DC current passing between the LIO and the GIO. Therefore, the sixth transistor 306 and the ninth transistor 309 are added to block the signal transmission on the unselected LIO data lines.

To sum up, the embodiments of the disclosure provide a sense amplifying circuit. In order to enable the transistor to be normally turned on at a low working voltage, a TFET is partially used in the circuit instead of a traditional MOSFET, and a first control signal is adopted to independently control on and off of the TFET transistor. In order to improve the reading speed of the DRAM, a differential structure and a pull-up structure are adopted to amplify the 0/1 signal transmitted by the circuit to a certain extent, to compensate for a level loss that occurs in the signal transmission process. In addition, because the TFET transistor may be turned on and work under ½ $V_{DD}$, the traditional MOSFET transistors are used as switches on the main data lines of the LIO and the GIO to control on-off. In particular, when the DRAM memory performs a read operation, since the unselected LIO data lines are charged to ½ $V_{DD}$, the fifth transistor 305 and the eighth transistor 308 are turned on, causing a DC current to pass between the LIO and the GIO. Therefore, the sixth transistor 306 and the ninth transistor 309 are added to block the signal transmission on the unselected LIO data lines.

The embodiments of the disclosure provide a sense amplifying circuit. This embodiment further explains the foregoing embodiments, some of the MOSFET transistors are replaced with the TFETs, the source terminal of the NTFET transistor is connected to $V_{SS}$, and the source terminal of the PTFET transistor is connected to the power supply $V_{DD}$, which overcomes the unidirectional conductivity problem of the TFET transistor. Moreover, a differential circuit structure is formed by using transistors of two different processes to amplify the signals transmitted from the LIO and /LIO data lines to a certain extent, thereby improving the reading speed of the DRAM memory.

Figure 13:
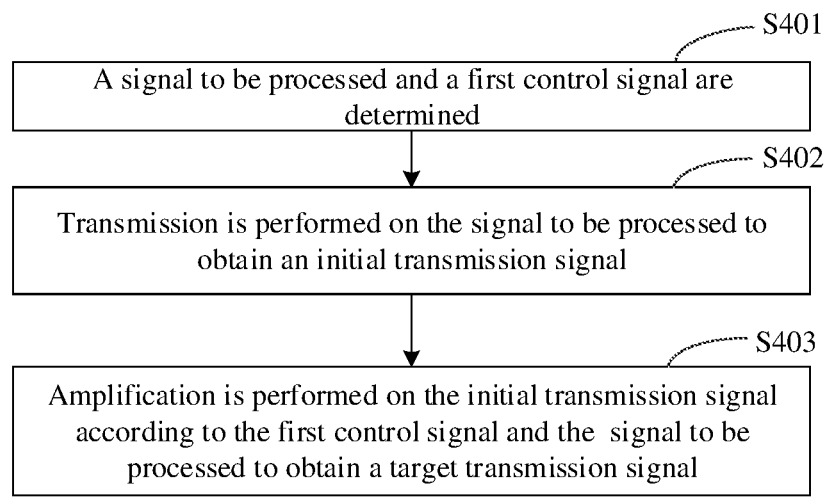
FIG. 13 is a schematic flowchart of a sense amplifying method according to an embodiment of the disclosure.

In another embodiment of the disclosure, FIG. 13 illustrates a schematic flowchart of a sense amplifying method according to the embodiment of the disclosure. As shown in FIG. 13, the method may include the following operations.

In S401, a signal to be processed and a first control signal are determined.

It is to be noted that the sense amplifying method in the embodiment of the disclosure is applied to the sense amplifying circuit 20, and the sense amplifying circuit 20 may be disposed in various signal transmission scenarios, and those skilled in the art may flexibly apply it. The structure of the sense amplifying circuit 20 may be as shown in FIG. 3 to FIG. 7.

The signal to be processed refers to a signal to be transmitted in a signal transmission scenario, and the first control signal is used for controlling whether the sense amplifying circuit 20 to perform a signal amplification operation.

In the embodiment of the disclosure, specific explanation is given by taking the sense amplifying circuit 20 disposed between the local data line and the global data line as an application scenario. In other words, the sense amplifying circuit 20 receives the signal to be processed from the local data line (the LIO and the /LIO), and transmits the target transmission signal to the global data line (the GIO and the /GIO).

In S402, transmission is performed on the signal to be processed to obtain an initial transmission signal.

In S403, amplification is performed on the initial transmission signal according to the first control signal and the signal to be processed to obtain a target transmission signal.

It is to be noted that, in a specific application scenario, the signal to be processed may lose a certain level state due to the load effect in the transmission process, and the transmission rate is slower. Therefore, in the embodiment of the disclosure, in the signal transmission process, the initial transmission signal is amplified to obtain the target transmission signal, thereby increasing the signal transmission speed and reducing the signal transmission delay.

The process of amplifying the initial transmission signal is performed via the first control signal and the signal to be processed.

In some embodiments, as shown in FIG. 7, the sense amplifying circuit 20 includes a first type transistor 2021 and a second type transistor 2022. The operation that amplification is performed on the initial transmission signal according to the first control signal and the signal to be processed to obtain the target transmission signal may include the following.

A working state of the first type transistor is controlled using the first control signal and the signal to be processed, and a working state of the second type transistor is controlled using the signal to be processed, so that the first type transistor and the second type transistor together perform amplification on the initial transmission signal to obtain the target transmission signal.

In some embodiments, the signal to be processed includes a first signal to be processed and a second signal to be processed, and the initial transmission signal includes a first initial transmission signal and a second initial transmission signal. The operation that transmission is performed on the signal to be processed to obtain the initial transmission signal may include the following.

A second control signal is received.

Responsive to the second control signal being in a first level state, transmission is performed on the first signal to be processed to obtain the first initial transmission signal, and transmission is performed on the second signal to be processed to obtain the second initial transmission signal.

It is to be noted that, the sense amplifying circuit 20 also needs to receive the second control signal, and controls the main signal transmission process according to the second control signal.

As shown in FIG. 4, the sense amplifying circuit 20 includes a transmission circuit 201 and an amplifying circuit 202. The second control signal is used for controlling the working state of the transmission circuit 201, so as to control the signal transmission process. The first control signal and the signal to be processed are used for controlling the working state of the amplifying circuit 202, so as to control the signal amplification process.

In some embodiments, the sense amplifying circuit 20 includes a first transistor 301 and a second transistor 302. Responsive to that the second control signal is in the first level state, the method may further include the following.

The first transistor 301 is controlled to be in an ON state, and transmission is performed on the first signal to be processed through the first transistor 301 to obtain the first initial transmission signal.

The second transistor 302 is controlled to be in an ON state, and transmission is performed on the second signal to be processed through the second transistor 302 to obtain the second initial transmission signal.

It is to be noted that, the first transistor 301 is provided between the LIO and the GIO, and the second transistor 302 is provided between the /LIO and the /GIO, so that when the first transistor 301 and the second transistor 302 are turned on, the first signal to be processed passes through the first transistor 301 to output the first initial transmission signal, and the second signal to be processed passes through the second transistor 302 to output the second initial transmission signal. Here, the first initial transmission signal and the second initial transmission signal together constitute the initial transmission signal.

In some embodiments, the operation that amplification is performed on the initial transmission signal based on the signal to be processed to obtain the target transmission signal may include the following.

A first power signal $V_{DD1}$, a second power signal $V_{DD2}$, and a ground signal $V_{SS}$ are applied.

When the first control signal is in the first level state, the first signal to be processed is in the first level state, and the second signal to be processed is in a second level state, amplification is performed on the initial transmission signal based on the first power signal $V_{DD1}$ and the ground signal $V_{SS}$ to obtain the target transmission signal.

Alternatively, when the first control signal is in the first level state, the first signal to be processed is in the second level state, and the second signal to be processed is in the first level state, amplification is performed on the initial transmission signal based on the second power signal $V_{DD2}$ and the ground signal $V_{SS}$ to obtain the target transmission signal.

It is to be noted that the signal amplification process may be understood as: using the power signal to pull up a high level signal in the initial transmission signal, and using the ground signal to pull down a low level signal in the initial transmission signal.

It is understood that the local data line includes the LIO and /LIO, and the global data line includes the GIO and /GIO. For the convenience of description, the signals at the LIO and the GIO are respectively referred to as a first signal to be processed, a first initial transmission signal, and a first target transmission signal. The signals at the /LIO and the /GIO are respectively referred to as a second signal to be processed, a second initial transmission signal, and a second target transmission signal. The first target transmission signal and the second target transmission signal are used for forming the target transmission signal, and the level state of the first target transmission signal is opposite to that of the second target transmission signal.

In one case, when the DRAM needs to read out a logic "1", the first signal to be processed is a high level signal, and the second signal to be processed is a low level signal. In this case, voltage pull-up processing is performed on the first initial transmission signal by using the second power signal $V_{DD2}$ to obtain the first target transmission signal, and meanwhile, voltage pull-down processing is performed on the second initial transmission signal by using the ground signal to obtain the second target transmission signal.

In another case, when the DRAM needs to read out a logic "0", the first signal to be processed is a low level signal, and the second signal to be processed is a high level signal. In this case, voltage pull-down processing is performed on the first initial transmission signal by using the ground signal to obtain the first target transmission signal, and meanwhile, voltage pull-up processing is performed on the second initial transmission signal by using the first power signal $V_{DD1}$ to obtain the second target transmission signal.

In some embodiments, as shown in FIG. 5, the amplifying circuit further includes a third transistor 303, a fourth transistor 304, a fifth transistor 305, a sixth transistor 306, and a seventh transistor 307. Responsive to that the first control signal is in the first level state, the first signal to be processed is in the second level state, and the second signal to be processed is in the first level state, the method may further include the following operations.

Charging processing is performed on the first initial transmission signal through the fifth transistor 305 based on the second power signal $V_{DD2}$ to obtain the first target transmission signal.

Discharging processing is performed on the second initial transmission signal through the third transistor 303, the sixth transistor 306, and the seventh transistor 307 based on the ground signal to obtain the second target transmission signal.

In some embodiments, as shown in FIG. 6, the sense amplifying circuit 20 further includes an eighth transistor 308 and a ninth transistor 309. Responsive to that the first control signal is in the first level state, the first signal to be processed is in the second level state, and the second signal to be processed is in the first level state, the method may further include the following operations.

Charging processing is performed on the second initial transmission signal through the eighth transistor 308 based on the first power signal $V_{DD1}$ to obtain the second target transmission signal.

Discharging processing is performed on the first initial transmission signal through the fourth transistor 304, the seventh transistor 307, and the ninth transistor 309 based on the ground signal to obtain the first target transmission signal.

Exemplarily, (1) when the DRAM needs to read out the logic "1", the first control signal is in a high level state, the first signal to be processed is a high level signal, and the second signal to be processed is a low level signal. In this case, the fifth transistor 305 is turned on, and the first initial transmission signal is charged by using the second power signal, thereby completing the voltage pull-up processing on the first initial transmission signal. The third transistor 303, the sixth transistor 306, and the seventh transistors 307 are turned on, and the second initial transmission signal is discharged by using the ground signal, thereby completing the voltage pull-down processing on the second initial transmission signal.

(2) When the DRAM needs to read out the logic "0", the first control signal is in a high level state, the first signal to be processed is a lower level signal, and the second signal to be processed is a high level signal. In this case, the eighth transistor 308 is turned on, and the second initial transmission signal is charged by using the first power signal $V_{DD1}$, thereby completing the voltage pull-up processing on the second initial transmission signal. The fourth transistor 304, the seventh transistor 307, and the ninth transistors 309 are turned on, and the first initial transmission signal is discharged by using the ground signal, thereby completing the voltage pull-down processing on the first initial transmission signal.

In the embodiment of the disclosure, the NTFET is turned on when the gate voltage is greater than or equal to ½ $V_{DD}$. The PTFET is turned on when the gate voltage is less than or equal to ½ $V_{DD}$. In this way, the amplifying circuit 202 may be controlled in a lower voltage environment, thereby reducing power consumption and improving control efficiency. However, if the amplifying circuit only adopts the TFETs, the unnecessary current may be generated on the unselected LIO data lines. Details may be referred to the foregoing content. Therefore, conventional MOSFET transistors also need to be introduced into the amplifying circuit to block the unnecessary current when the amplifying circuit is not selected.

Therefore, in some embodiments, the method may further include the following operations.

Responsive to the sense amplifying circuit being in a selected state, the signal to be processed is generated, and the sense amplifying circuit is controlled to be in a working state according to the signal to be processed.

Responsive to the sense amplifying circuit being in an unselected state, a reference signal is generated, and the sense amplifying circuit is controlled to be in a blocking state according to the reference signal.

A level state of the reference signal is between the working voltage of the first type transistor and the working voltage of the second type transistor.

In this way, the working state of the sense amplifying circuit may be controlled by the first control signal, the second control signal, and the signal to be processed, so as to realize the amplification on the initial transmission signal, thereby increasing the signal transmission rate and improving the signal delay. At the same time, the amplifying circuit is realized by two types of transistors, and may work in a low voltage environment and have a wider range of application scenarios.

The embodiment of the disclosure provides a sense amplifying method. The sense amplifying circuit may include the following operations. A signal to be processed and a first control signal are determined. Transmission is performed on the signal to be processed to obtain an initial transmission signal. Amplification is performed on the initial transmission signal according to the first control signal and the signal to be processed to obtain a target transmission signal. In this way, amplification is performed on signals by the sense amplifying circuit in the signal transmission process, thereby increasing the signal transmission speed and reducing the signal transmission delay.

Figure 14:
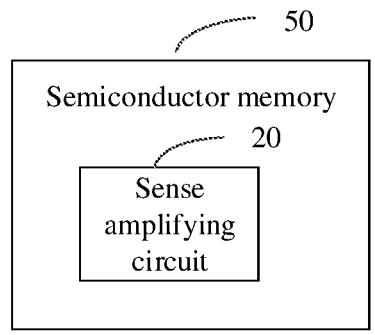
FIG. 14 is a schematic structural diagram of a semiconductor memory according to an embodiment of the disclosure.

In still another embodiment of the disclosure, FIG. 14 illustrates a schematic structural diagram of a semiconductor memory 50 according to the embodiment of the disclosure. As shown in FIG. 14, the semiconductor memory 50 includes the sense amplifying circuit 20 according to any one of the foregoing embodiments.

In some embodiments, the semiconductor memory 50 includes at least a Dynamic Random Access Memory (DRAM).

The embodiment of the disclosure provides a semiconductor memory. The semiconductor memory includes the foregoing sense amplifying circuit. Amplification is performed on signals in the signal transmission process, thereby increasing the signal transmission speed and reducing the signal transmission delay.

The above are only preferred embodiments of the disclosure, and are not intended to limit the protection scope of the disclosure.

It is to be noted that, the terms "including", "comprising" or any other variants thereof in the disclosure are intended to cover non-exclusive inclusion, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in the method embodiments provided in the disclosure can be combined arbitrarily without conflict to obtain new method embodiments.

The features disclosed in the product embodiments provided in the disclosure can be combined arbitrarily without conflict to obtain new product embodiments.

The features disclosed in the method or device embodiments provided in the disclosure can be combined arbitrarily without conflict to obtain new method or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The embodiments of the disclosure provide a sense amplifying circuit and method, and a semiconductor memory. The sense amplifying circuit includes a transmission circuit and an amplifying circuit. The transmission circuit is configured to receive a signal to be processed and perform transmission on the signal to be processed to obtain an initial transmission signal. The amplifying circuit is configured to receive a first control signal and the signal to be processed, and perform amplification on the initial transmission signal according to the first control signal and the signal to be processed to obtain a target transmission signal. In this way, signals are amplified by the sense amplifying circuit in the signal transmission process, thereby increasing the signal transmission speed and reducing the signal transmission delay.

The invention claimed is:

1. A sense amplifying circuit, comprising:
a transmission circuit, configured to receive a signal to be processed, and perform transmission on the signal to be processed to obtain an initial transmission signal; and
an amplifying circuit, configured to receive a first control signal and the signal to be processed, and perform amplification on the initial transmission signal according to the first control signal and the signal to be processed to obtain a target transmission signal; and,
wherein the signal to be processed comprises a first signal to be processed and a second signal to be processed, and the initial transmission signal comprises a first initial transmission signal and a second initial transmission signal;
the transmission circuit comprises a first transistor and a second transistor and is configured to receive a second control signal, and responsive to the second control signal being in a first level state, perform transmission on the first signal to be processed through the first transistor to obtain the first initial transmission signal, and perform transmission on the second signal to be processed through the second transistor to obtain the second initial transmission signal;
the amplifying circuit is configured to: receive a first power signal, a second power signal, and a ground signal; and performing at least one of:
responsive to that the first control signal is in the first level state, the first signal to be processed is in the first level state, and the second signal to be processed is in a second level state, perform amplification on the initial transmission signal based on the first power signal and the ground signal to obtain the target transmission signal; or
responsive to that the first control signal is in the first level state, the first signal to be processed is in the second level state, and the second signal to be processed is in the first level state, perform amplification on the initial transmission signal based on the second power signal and the ground signal to obtain the target transmission signal.

2. The sense amplifying circuit of claim 1, wherein
a first terminal of the first transistor is connected to a first terminal of the second transistor for receiving the second control signal;
a second terminal of the first transistor is configured to receive the first signal to be processed, and a third terminal of the first transistor is configured to output the first initial transmission signal; and
a second terminal of the second transistor is configured to receive the second signal to be processed, and a third terminal of the second transistor is configured to output the second initial transmission signal.

3. The sense amplifying circuit of claim 2, wherein
the transmission circuit is further configured to control the first transistor and the second transistor to be in an ON state responsive to the second control signal being in the first level state, or to control the first transistor and the second transistor to be in an OFF state responsive to the second control signal being in a second level state.

4. The sense amplifying circuit of claim 1, wherein the target transmission signal comprises a first target transmission signal and a second target transmission signal; the amplifying circuit comprises a third transistor, a fourth transistor, a fifth transistor, a sixth transistor, a seventh transistor, an eighth transistor, and a ninth transistor; and the third transistor, the fourth transistor, the fifth transistor, the seventh transistor, and the eighth transistor are first type transistors, the sixth transistor and the ninth transistor are second type transistors, and a working voltage of the first type transistor is less than a working voltage of the second type transistor, wherein
a first terminal of the third transistor, a first terminal of the fourth transistor, and a first terminal of the seventh transistor are connected to the first control signal; a second terminal of the fifth transistor is connected to the second power signal, a second terminal of the eighth transistor is connected to the first power signal, and a third terminal of the seventh transistor is connected to the ground signal; a first terminal of the eighth transistor and a first terminal of the sixth transistor are connected to the first signal to be processed; a first terminal of the fifth transistor and a first terminal of the ninth transistor are connected to the second signal to be processed; a third terminal of the sixth transistor, a second terminal of the seventh transistor, and a third terminal of the ninth transistor are connected to each other; a second terminal of the sixth transistor is connected to a third terminal of the third transistor; and a second terminal of the ninth transistor is connected to a third terminal of the fourth transistor; and
a second terminal of the fourth transistor is connected to a third terminal of the fifth transistor for outputting the first target transmission signal; and a second terminal of the third transistor is connected to a third terminal of the eighth transistor for outputting the second target transmission signal.

5. The sense amplifying circuit of claim 4, wherein
the amplifying circuit is further configured to perform, responsive to that the first control signal is in the first level state, the first signal to be processed is in the first level state, and the second signal to be processed is in a second level state, charging processing on the first initial transmission signal through the fifth transistor based on the second power signal to obtain the first target transmission signal, and perform discharging processing on the second initial transmission signal through the third transistor, the sixth transistor, and the seventh transistor based on the ground signal to obtain the second target transmission signal.

6. The sense amplifying circuit of claim 4, wherein
the amplifying circuit is further configured to determine, responsive to that the first control signal is in the first level state, the first signal to be processed is in the first level state, and the second signal to be processed is in a second level state, that the fifth transistor, the sixth transistor, and the seventh transistor are in an ON state, and the eighth transistor and the ninth transistor are in an OFF state; or
the amplifying circuit is further configured to perform, responsive to the first control signal is in the first level state, the first signal to be processed is in the second level state, and the second signal to be processed is in the first level state, charging processing on the second initial transmission signal through the eighth transistor based on the first power signal to obtain the second target transmission signal, and perform discharging processing on the first initial transmission signal through the fourth transistor, the seventh transistor, and the ninth transistor based on the ground signal to obtain the first target transmission signal.

7. The sense amplifying circuit of claim 6, wherein the amplifying circuit is further configured to determine, responsive to that the first control signal is in the first level state, the first signal to be processed is in the second level state, and the second signal to be processed is in the first level state, that the seventh transistor, the eighth transistor, and the ninth transistor are in an ON state, and the fifth transistor and the sixth transistor are in an OFF state.

8. The sense amplifying circuit of claim 4, wherein the sense amplifying circuit is further configured to generate the signal to be processed in a selected state, or generate a reference signal in an unselected state, wherein a level state of the reference signal is between the working voltage of the first type transistor and the working voltage of the second type transistor; and
the amplifying circuit is further configured to control the sense amplifying circuit to be in a working state through the second type transistors according to the signal to be processed, or control the sense amplifying circuit to be in a blocking state through the second type transistors according to the reference signal.

9. The sense amplifying circuit of claim 8, wherein the amplifying circuit is further configured to:
control the sixth transistor to be in an ON state and the ninth transistor to be in an OFF state, or the sixth transistor to be in an OFF state and the ninth transistor to be in an ON state according to the signal to be processed, to enable the sense amplifying circuit to be in the working state; or
control the sixth transistor and the ninth transistor to be in an OFF state according to the reference signal, to enable the sense amplifying circuit to be in the blocking state.

10. The sense amplifying circuit of claim 6, wherein the first level state is higher than the second level state;
the third transistor, the fourth transistor, and the seventh transistor are N-type tunnel field-effect transistors (TFETs); the fifth transistor and the eighth transistor are P-type TFETs; and the first transistor, the second transistor, the sixth transistor, and the ninth transistor are N-type metal-oxide-semiconductor field-effect transistors (MOSFETs), wherein
a first terminal of the P-type TFET is a gate pin, a second terminal of the P-type TFET is a source pin, and a third terminal of the P-type TFET is a drain pin; a first terminal of the N-type TFET is a gate pin, a second terminal of the N-type TFET is a drain pin, and a third terminal of the N-type TFET is a source pin; and a first terminal of the N-type MOSFET is a gate pin, a second terminal of the N-type MOSFET is a drain pin, and a third terminal of the N-type MOSFET is a source pin.

11. A sense amplifying method, applicable to a sense amplifying circuit, the method comprising:
determining a signal to be processed and a first control signal;
performing transmission on the signal to be processed to obtain an initial transmission signal; and
performing amplification on the initial transmission signal according to the first control signal and the signal to be processed to obtain a target transmission signal; and,
wherein the signal to be processed comprises a first signal to be processed and a second signal to be processed, and the initial transmission signal comprises a first initial transmission signal and a second initial transmission signal; and performing transmission on the signal to be processed to obtain the initial transmission signal comprises:
receiving a second control signal;
responsive to the second control signal being in a first level state, performing transmission on the first signal to be processed to obtain the first initial transmission signal, and performing transmission on the second signal to be processed to obtain the second initial transmission signal;
performing amplification on the initial transmission signal according to the first control signal and the signal to be processed to obtain the target transmission signal comprises:
applying a first power signal, a second power signal, and a ground signal; and performing at least one of:
responsive to that the first control signal is in the first level state, the first signal to be processed is in the first level state, and the second signal to be processed is in a second level state, performing amplification on the initial transmission signal based on the first power signal and the ground signal to obtain the target transmission signal; or
responsive to that the first control signal is in the first level state, the first signal to be processed is in the second level state, and the second signal to be processed is in the first level state, performing amplification on the initial transmission signal based on the second power signal and the ground signal to obtain the target transmission signal.

12. The sense amplifying method of claim 11, wherein the sense amplifying circuit comprises a first transistor and a second transistor; and responsive to the second control signal being in the first level state, the method further comprises:
controlling the first transistor to be in an ON state, and performing transmission on the first signal to be processed through the first transistor to obtain the first initial transmission signal; and
controlling the second transistor to be in an ON state, and performing transmission on the second signal to be processed through the second transistor to obtain the second initial transmission signal.

13. The sense amplifying method of claim 12, wherein the target transmission signal comprises a first target transmission signal and a second target transmission signal; the amplifying circuit further comprises a third transistor, a fourth transistor, a fifth transistor, a sixth transistor, and a seventh transistor; and responsive to that the first control signal is in the first level state, the first signal to be processed is in the second level state, and the second signal to be processed is in the first level state, the method further comprises:
performing charging processing on the first initial transmission signal through the fifth transistor based on the second power signal to obtain the first target transmission signal; and
performing discharging processing on the second initial transmission signal through the third transistor, the sixth transistor, and the seventh transistor based on the ground signal to obtain the second target transmission signal;
wherein the third transistor, the fourth transistor, the fifth transistor, and the seventh transistor are first type transistors, the sixth transistor is a second type transistor, and a working voltage of the first type transistor is less than a working voltage of the second type transistor.

14. The sense amplifying method of claim 13, wherein the amplifying circuit further comprises an eighth transistor and a ninth transistor; and responsive to that the first control signal is in the first level state, the first signal to be processed is in the second level state, and the second signal to be processed is in the first level state, the method further comprises:
   performing charging processing on the second initial transmission signal through the eighth transistor based on the first power signal to obtain the second target transmission signal; and
   performing discharging processing on the first initial transmission signal through the fourth transistor, the seventh transistor, and the ninth transistor based on the ground signal to obtain the first target transmission signal.

15. The sense amplifying method of claim 13, further comprising:
   responsive to that the sense amplifying circuit is in a selected state, generating the signal to be processed, and controlling the sense amplifying circuit to be in a working state through the second type transistors according to the signal to be processed; and
   responsive to that the sense amplifying circuit is in an unselected state, generating a reference signal, and controlling the sense amplifying circuit to be in a blocking state through the second type transistors according to the reference signal;
   wherein a level state of the reference signal is between the working voltage of the first type transistor and the working voltage of the second type transistor.

16. A semiconductor memory, comprising the sense amplifying circuit of claim 1.

* * * * *